United States Patent
Nerreter

(10) Patent No.: US 11,169,336 B2
(45) Date of Patent: Nov. 9, 2021

(54) ELECTRO-OPTICAL CIRCUIT COMPRISING AN OPTICAL TRANSMISSION PATH, ELECTRO-OPTICAL ASSEMBLY FOR INSTALLATION IN SUCH AN ELECTRO-OPTICAL CIRCUIT AND METHOD FOR PRODUCING AN OPTICAL INTERFACE OF AN ELECTRO-OPTICAL CIRCUIT

(71) Applicant: Siemens Aktiengesellschaft, Munich (DE)

(72) Inventor: Stefan Nerreter, Heidesee OT Blossin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 118 days.

(21) Appl. No.: 16/491,984

(22) PCT Filed: Feb. 13, 2018

(86) PCT No.: PCT/EP2018/053498
§ 371 (c)(1),
(2) Date: Sep. 6, 2019

(87) PCT Pub. No.: WO2018/162179
PCT Pub. Date: Sep. 13, 2018

(65) Prior Publication Data
US 2021/0132307 A1    May 6, 2021

(30) Foreign Application Priority Data

Mar. 10, 2017  (EP) .................................... 17160347

(51) Int. Cl.
*G02B 6/42* (2006.01)
*H05K 1/18* (2006.01)

(52) U.S. Cl.
CPC ......... *G02B 6/4245* (2013.01); *G02B 6/4228* (2013.01); *G02B 6/4238* (2013.01); *H05K 1/183* (2013.01)

(58) Field of Classification Search
CPC ............................. G02B 6/4245; H01K 1/183
See application file for complete search history.

(56) References Cited

U.S. PATENT DOCUMENTS

| | | | | |
|---|---|---|---|---|
| 6,718,079 B1 * | 4/2004 | Gidon | ...................... | G02B 6/42 385/14 |
| 7,522,648 B2 * | 4/2009 | Park | ..................... | G02B 6/4232 372/50.1 |

(Continued)

FOREIGN PATENT DOCUMENTS

| | | | | |
|---|---|---|---|---|
| CN | 101509989 A | 8/2009 | ............... | G02B 6/12 |
| DE | 10 2004 034 332 B3 | 5/2005 | ............... | G02B 6/42 |
| WO | 2018/162179 A1 | 9/2018 | ............... | G02B 6/42 |

OTHER PUBLICATIONS

Chinese Office Action, Application No. 201880016923.2, 18 pages, dated Aug. 25, 2020.

(Continued)

*Primary Examiner* — Charlie Y Peng
(74) *Attorney, Agent, or Firm* — Slayden Grubert Beard PLLC

(57) ABSTRACT

Various embodiments include an electro-optical circuit with an optical transmission path comprising: an electro-optical assembly having an optical transmitter element and/or an optical receiver element mounted on a mounting surface of a carrier component; a circuit carrier with a mounting side and an embedded optical waveguide exposed with an end face in a cutout in the mounting side; and an optical interface between the electro-optical assembly and the optical waveguide. The optical transmitter element and/or the optical receiver element is mounted on the carrier component with (Continued)

an alignment of its respective optical axis parallel to the mounting surface. The optical assembly is mounted on the circuit carrier with the mounting surface facing toward the mounting side. The optical transmitter element and/or the optical receiver element projects into the cutout and forms an optical axis with the exposed optical waveguide.

14 Claims, 2 Drawing Sheets

(56) References Cited

U.S. PATENT DOCUMENTS

| | | | | |
|---|---|---|---|---|
| 2005/0023434 A1* | 2/2005 | Yacoubian | ............. | G01N 29/30 |
| | | | | 250/200 |
| 2005/0089262 A1* | 4/2005 | Jenkins | ................ | G02B 6/125 |
| | | | | 385/14 |
| 2006/0093259 A1 | 5/2006 | Oggioni | ........................ | 385/31 |
| 2007/0147729 A1 | 6/2007 | Dellmann et al. | .............. | 385/14 |
| 2009/0169219 A1* | 7/2009 | Nakano | ................. | H05K 1/183 |
| | | | | 398/200 |
| 2009/0208167 A1 | 8/2009 | Hodono | ........................ | 385/14 |
| 2011/0064354 A1* | 3/2011 | Nishio | ................. | G02B 6/4214 |
| | | | | 385/14 |
| 2016/0109668 A1 | 4/2016 | Pfnuer | ............................. | 385/3 |
| 2016/0341902 A1 | 11/2016 | Wang | ............................. | 385/33 |

OTHER PUBLICATIONS

Search Report for International Application No. PCT/EP2018/053498, 4 pages, dated May 23, 2018.

Extended European Search Report, Application No. 17160347.5, 8 pages, dated Sep. 22, 2017.

* cited by examiner

ELECTRO-OPTICAL CIRCUIT COMPRISING AN OPTICAL TRANSMISSION PATH, ELECTRO-OPTICAL ASSEMBLY FOR INSTALLATION IN SUCH AN ELECTRO-OPTICAL CIRCUIT AND METHOD FOR PRODUCING AN OPTICAL INTERFACE OF AN ELECTRO-OPTICAL CIRCUIT

CROSS-REFERENCE TO RELATED APPLICATIONS

This application is a U.S. National Stage Application of International Application No. PCT/EP2018/053498 filed Feb. 13, 2018, which designates the United States of America, and claims priority to EP Application No. 17160347.5 filed Mar. 10, 2017, the contents of which are hereby incorporated by reference in their entirety.

TECHNICAL FIELD

The present disclosure relates to electro-optical circuits with an optical transmission path. Various embodiments of the teachings herein include electro-optical circuits with an electro-optical assembly including an optical transmitter element and/or an optical receiver element mounted on a mounting surface of the carrier component.

BACKGROUND

According to DE 10 2004 034 332 B3, a surface-mountable electro-optical assembly with an optical transmitter element or receiver element can be contacted electrically on a circuit carrier. Here, an interface between the optical transmitter element or optical receiver element and an optical waveguide integrated into the circuit carrier is produced by a beam deflection being introduced into an indentation of the circuit carrier. This makes it possible to arrange the optical transmitter element and optical receiver element on the top side of the circuit carrier with a perpendicularly aligned optical transmission axis, the coupling in or coupling out of the light signals into or out of the horizontally aligned optical waveguide being ensured by means of the beam deflection. The positioning accuracy required for this purpose is achieved by means of a limit stop, which is intended to facilitate compliance with the tolerance requirements applicable to the mounting of optical components.

SUMMARY

The teachings of the present disclosure describe electro-optical circuits with an optical transmission path, an electro-optical assembly with an optical transmitter element and/or an optical receiver element and a method for producing an optical interface in an electro-optical circuit, wherein it should be possible to form the optical interface with minimal mounting effort and it should be possible to manufacture the optical joining members involved in a cost-effective manner. For example, some embodiments include circuits wherein the optical transmitter element and/or the optical receiver element being mounted on the carrier component with an alignment of its respective optical axis parallel to the mounting surface. The optical assembly is furthermore mounted on the circuit carrier with the mounting surface in such a way that the mounting surface faces toward the mounting side of the circuit carrier. Here, the optical transmitter element and/or the optical receiver element projects into the cutout and with the exposed optical waveguide forms a single optical axis (this being subject to tolerance as explained in more detail below). This means that the optical transmitter element and/or optical receiver element is aligned with the transmission direction of the defined optical axis in the direction of the optical waveguide, so that the optical interfaces can be realized without a beam deflection. This means that a single optical axis is sufficient for the transmission path.

BRIEF DESCRIPTION OF THE DRAWINGS

Further details of the teachings herein are described below with reference to the drawings. Identical or corresponding drawing elements are provided with the same reference characters in each case and are explained multiple times only insofar as differences arise between the individual figures. The features of the individual figures can be combined with one another and thus result in further embodiment variants of the teachings. In the drawing.

DETAILED DESCRIPTION

Figure 1:
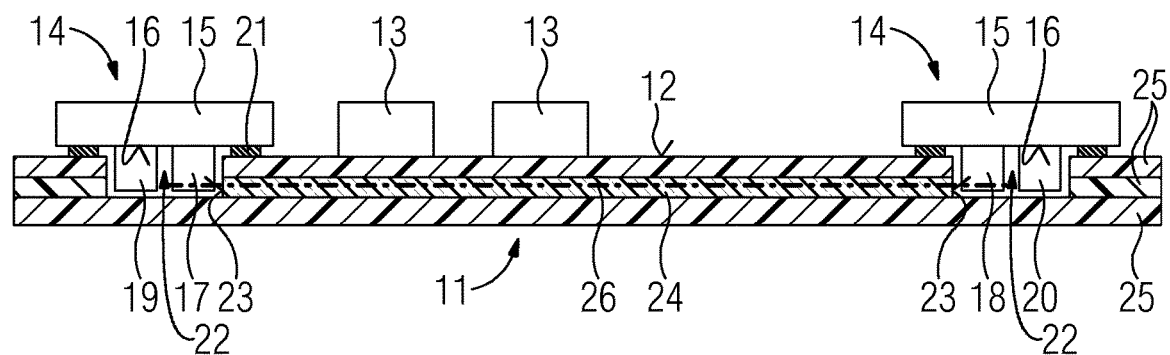
FIG. 1 shows an exemplary embodiment of the electro-optical circuit incorporating teachings of the present disclosure in a schematic cross-section.

A configuration without deflection elements has the following advantages. Firstly, the beam deflection element is dispensed with, as a result of which the deployed electronic assembly with the optical transmitter element and/or the optical receiver element (referred to in the following for short as optical elements, it being possible for these to be realized as optical transmitter and/or optical receiver elements) can be manufactured with a low manufacturing outlay. Furthermore, the arrangement of the optical elements and the optical waveguide in a single optical axis produces an optical interface in which an optical transmission can be enabled in a greater tolerance range. The mounting of the optical assembly on the circuit carrier is also simplified as a result. In some embodiments, it is possible to carry out the mounting of the electro-optical assembly with tolerance requirements that also apply to the mounting of electronic components, greater tolerance ranges being applicable here than for mounting optical components. This simplifies and reduces the cost of the mounting method of the electro-optical assembly.

In some embodiments, first contact surfaces are embodied on the mounting surface of the carrier component, on which first contact surfaces the optical transmitter element and/or the optical receiver element is electrically contacted. The mounting of said optical element on the carrier component is thus also mounted with the tolerance requirements applicable for mounting electronic components. By way of the electrical contacting, the optical element is on the one hand fixed and on the other hand electrically contacted in order to ensure an energy supply or to emit electrical signals. Here, the electro-optical assembly can be supplemented by components that support this function. For an optical transmitter element, for instance, a driver circuit can be integrated into the electro-optical assembly. For an optical receiver element, an amplifier circuit can be integrated so that the electrical signals generated on account of an optical-electrical conversion can continue to be processed (signal conditioning).

In some embodiments, second contact surfaces are provided on the mounting surface, which second contact surfaces are electrically connected to the first contact surfaces, and are electrically connected to third contact surfaces on the mounting side of the circuit carrier. In this way, it is possible to exchange electrical signals between the circuit carrier and the electro-optical assembly. The electro-optical assembly can thus communicate in terms of signaling technology with the electro-optical circuit. Furthermore, these electrical contacts can also serve to fix the electro-optical assembly mechanically on the circuit carrier; as already explained, on account of the advantageous comparatively low tolerance requirements, the electro-optical assembly can be aligned with the optical waveguide to form the interface during the electrical mounting process, as the typically higher tolerance requirements for mounting optical components do not need to be met.

In some embodiments, the second contact surfaces are distributed symmetrically around the optical transmitter element and/or the optical receiver element. This ensures that tolerances arising during the establishment of the electrical connection can be kept as small as possible. For instance, the electro-optical assembly is then lowered more evenly during formation of the electrical connections if the joining auxiliary material, for instance a soldering material, is reduced in volume during the formation of the electrical connections. This advantageously reduces the risk of an electro-optical assembly being aligned at an angle to the mounting side of the circuit carrier.

In some embodiments, first additional contact surfaces are provided on the mounting surface, which first additional contact surfaces have no electrical connection to the circuit formed by the electro-optical assembly. These first additional contact surfaces are each connected to second additional contact surfaces on the mounting side of the circuit carrier. In some embodiments, first and second additional contact surfaces of this kind therefore do not serve to establish an electrical contacting of individual function elements but instead supplement the arrangement of the second and third contact surfaces so that, particularly advantageously, the totality of the second contact surfaces and the first additional contact surfaces can be distributed symmetrically around the optical transmitter element and/or the optical receiver element. This is also possible if an expedient symmetrical arrangement of the second contact surfaces would not be possible on account of their number.

In some embodiments, several optical transmitter elements and/or or optical receiver elements are mounted on the carrier component. In use cases in which several optical waveguides are embedded in a circuit carrier, this can further simplify the mounting process by the optical elements required for the formation of several interfaces being grouped together on one carrier component. The manufacturing outlay for such an electro-optical assembly can also be reduced advantageously.

In some embodiments, the optical waveguide is embodied as a glass waveguide, in other words consists of an optical glass. This material is relatively temperature-stable in particular in comparison with optical plastics. It is therefore possible for an electro-optical circuit in which glass waveguides are used in the circuit carrier to be subjected to a comparatively high thermal load during a soldering process without damage being incurred to the circuit carrier. In particular, the soldered connections can therefore also be formed by means of a reflow soldering process.

In some embodiments, the optical waveguide has a cross-sectional area of at least 0.05 mm$^2$ and at most 1 mm$^2$. For a square cross-section, this corresponds to an edge length of the cross-section of approximately 225 μm to 1 mm. In some embodiments, the optical waveguide is round and has a diameter of at least 250 μm and at most 1000 μm. It has been shown that, with these cross-sectional areas, a sufficiently large tolerance range is available for the formation of the optical interface, a sufficient optical transmission quality being achieved within the tolerance range. In some embodiments, a transmission of optical signals can be ensured if the optical transmitter element transmits optical signals at a frequency of at least 1 kHz and at most 1 MHz and/or the optical receiver element receives optical signals at a frequency of at least 1 kHz and at most 1 MHz. Within this frequency range, the requirements for transmission quality are not too high, so that the transmission quality in the range required for the envisaged mounting is possible.

In some embodiments, the permissible positioning tolerances between the electro-optical assembly and the circuit carrier in a direction perpendicular to the mounting side amount to at most half the height of the optical waveguide, e.g. at most one third of the height of the optical waveguide, and in a direction parallel to the end face of the optical waveguide and parallel to the mounting side at most half the width of the optical waveguide, e.g. at most one third of the width of the optical waveguide. It should be noted here that the height perpendicular to the mounting side and the width parallel to the mounting side is measured, since the cross-section of the optical waveguide lies perpendicular to the mounting side of the circuit carrier. It has been shown that the optical losses associated with said displacement are not too high, so as to still ensure the required transmission quality.

In some embodiments, the carrier component has a spacer block, on which the optical transmitter element and/or the optical receiver element is mounted. This spacer block can be used to compensate for height differences of the optical axis of the optical waveguide and the optical element, which design-related height differences can occur as a function of the dimensions of the optical element and the position of the embedded optical waveguide in the circuit carrier.

In some embodiments, the optical transmitter element and/or the optical receiver element is equipped with an optical collection component, in particular an optical collimation component. Hereby the light incidence of a transmitter element can be concentrated onto the end face of the optical waveguide in order to minimize the light losses, in particular where tolerances occur. In exactly the same way, the light signal coupled out of the optical waveguide can be concentrated by means of an optical collection component onto the receiving surface of the optical receiver element.

In some embodiments, an electro-optical assembly includes an optical transmitter element and/or the optical receiver element mounted on the carrier component with an alignment of its respective optical axis parallel to the mounting surface. Here, the mounting surface embodies a mounting area extending around the optical transmitter element and/or the optical receiver element for mounting on a circuit carrier having a cutout for the electro-optical assembly. As already mentioned, such an electro-optical assembly can be mounted on the associated circuit carrier with means for mounting electronic components, the optical configuration being embodied in such a way that the tolerances occurring when mounting electronic components ensure an optical signal transmission with a sufficient quality.

Further modifications of the electro-optical assembly have already been explained above in connection with the description of the electro-optical circuit. In particular, second contact surfaces and first additional contact surfaces can be embodied on the mounting surface of the carrier component in order to enable an electrical contacting on the associated circuit carrier on third contact surfaces and second additional contact surfaces. The second contact surfaces or the totality of the second contact surfaces and first additional contact surfaces can be distributed in particular symmetrically around the optical transmitter element and/or the optical receiver element. Transmission frequencies for the optical elements of the electro-optical assembly of at least 1 KHz and at most 1 MHz may be advantageous. A spacer block can be provided on the carrier component for mounting the optical elements. The optical elements can also be equipped with an optical collection component.

In some embodiments, a method includes the optical interface between the electro-optical assembly mounted on the circuit carrier and the optical waveguide is produced by the optical transmitter element and/or the optical receiver element being mounted on the carrier component with an alignment of its respective optical axis parallel to the mounting surface of the carrier component. The optical assembly is then mounted on the circuit carrier with the mounting surface facing toward the mounting side, wherein the optical transmitter element and/or the optical receiver element is introduced into the cutout and forms an optical axis with the exposed waveguide, in other words the optical element or the optical elements and the optical waveguide (taking into consideration permissible tolerances between the optical elements and the optical waveguide) lie on one optical axis. A beam deflection between the optical axis of the respective optical element and the optical axis of the optical waveguide is therefore not required. As a result, electro-optical circuits having the advantages set out above are realized with the method according to the invention. The method can advantageously be carried out comparatively cost-effectively, since comparatively large mounting tolerances can be accepted during mounting.

In some embodiments, the electro-optical assembly is mounted on the circuit carrier by establishing an electrical connection between the carrier component and the circuit carrier. Here, it is necessary to take into consideration the tolerances which are customary for mounting electronic components, as these are also sufficient for an alignment of the optical elements in relation to the optical waveguide. At the same time, the electro-optical assembly can be actuated and supplied with electrical energy from the circuit carrier via the electrical connections produced.

In some embodiments, during mounting, as the permissible positioning tolerance between the electro-optical assembly and the circuit carrier in a direction perpendicular to the mounting side, at most half the height of the optical waveguide, or at most one third of the height of the optical waveguide, is complied with and in a direction parallel to the end face of the optical waveguide and parallel to the mounting side at most half the width of the optical waveguide, or at most one third of the width of the optical waveguide, is complied with. It can thus be ensured that, in the interfaces between optical waveguide and optical elements, a sufficiently high transmission quality is guaranteed.

If the tolerances to be considered for a certain mounting method are known, then on the basis of these it is also possible to determine the cross-section of the optical waveguide that must be embedded into the circuit carrier in order that a sufficient transmission quality can be achieved in the optical interfaces when the tolerance field is exploited.

FIG. 1 illustrates an electro-optical circuit incorporating teachings of the present disclosure. This comprises a circuit carrier 11, which makes available a mounting side 12. On this mounting side 12, electrical elements 13 can be mounted. Furthermore, two electro-optical assemblies 14 are mounted on the mounting side 12. The electro-optical assemblies 14 each have a carrier component 15, which has a mounting surface 16 for receiving an optical transmitter element 17 or an optical receiver element 18. In addition, electrical elements for a signal conditioning of the optical elements can also be mounted on the mounting side 16 of the carrier component 15. This can for example be a driver electronic component 19 for the optical transmitter element and an amplifier electronic component 20 for the optical receiver element 18.

The electro-optical assemblies 14 are mounted via electrical connections 21 on the circuit carrier 11. Here, the mounting surface 16 of the carrier component 14 faces toward the mounting side 12 of the circuit carrier 11, so that the optical transmitter element 17, the optical receiver element 18, the driver electronic component 19 and the amplifier electronic component 20 project into cutouts 22 provided for this purpose in the mounting side 12 of the carrier component 11. These cutouts 22 in each case expose end faces 23 of an optical waveguide 24, which is embedded between individual layers 25 of the circuit carrier 11. The exposed end faces 23 therefore form optical interfaces with the optical transmitter element 17 and the optical receiver element 18, so that an optical transmission path is produced. As a result of said optical elements 17, 18 projecting into the cutouts 22, the optical axes of the transmitter element 17, the receiver element 18 and the optical waveguide 24 are aligned in such a way that a single optical axis 26 (albeit subject to tolerance) is produced.

Figure 2:
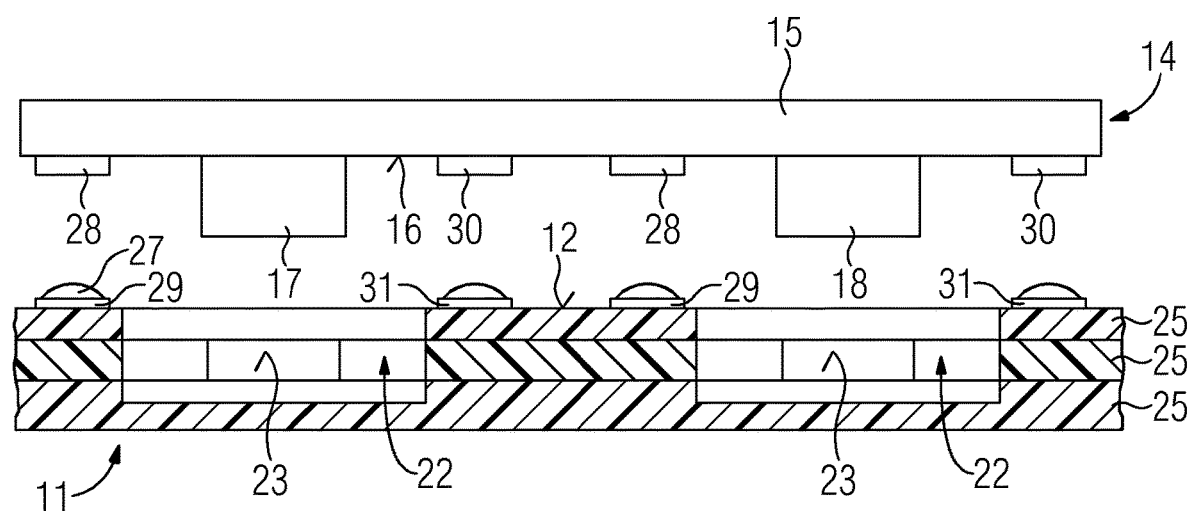
FIG. 2 shows another exemplary embodiment of the electro-optical circuit incorporating teachings of the present disclosure as a segment with a method step of an exemplary embodiment of the method incorporating teachings of the present disclosure.

FIG. 2 illustrates an electro-optical assembly 14 incorporating teachings of the present disclosure, on which two optical elements, namely the optical transmitter element 17 and the optical receiver element 18, are attached to the mounting surface 16. These two optical elements can therefore be mounted simultaneously by the electro-optical assembly 14 being placed into two cutouts 22 provided for this purpose. Instead of two cutouts 22 as shown in FIG. 2, a single cutout can also be provided (not shown). Here it is merely necessary to consider that the end faces 23 of the optical waveguides lie sufficiently far apart from one other so that the optical transmission of the signals is not disturbed.

The electro-optical assembly 14 is connected to the circuit carrier 11 through the formation of soldered connections. For this purpose, soldering material 27 is provided on the circuit carrier 11. After mounting (not shown in FIG. 2), the soldering material 27 connects second contact surfaces 28 of the circuit carrier 15 to third contact surfaces 29 of the circuit carrier 11. The second contact surfaces 28 are each connected, in a manner not shown in more detail, to the optical transmitter element 17 or the optical receiver element 18, so that these can for example be actuated via the electrical elements 13 on the circuit carrier (cf. FIG. 1).

Furthermore, first additional contact surfaces 30 are provided on the carrier component 14 and second additional contact surfaces 31 are provided on the carrier component 11, which are also to be connected to one another with the soldering material 27. These do not assume any electrical function, but mechanically stabilize the connection between the electro-optical assembly 14 and the circuit carrier 11.

Figure 3:
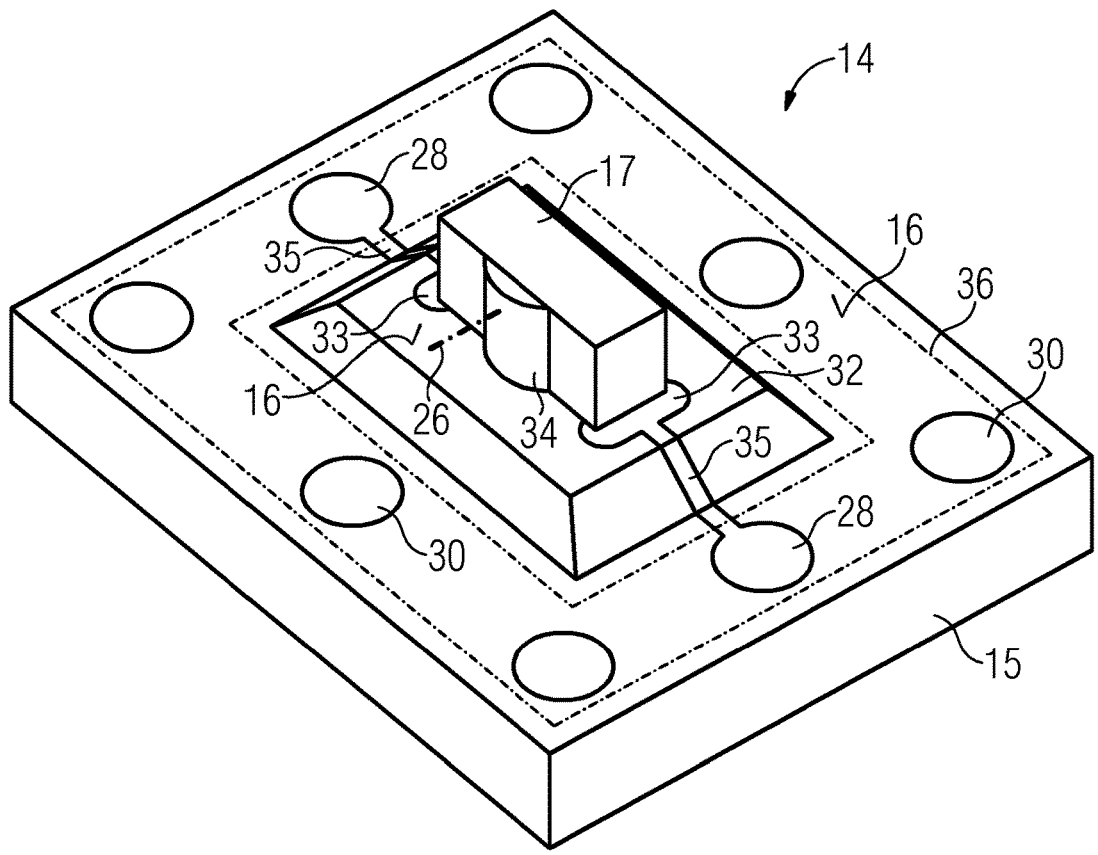
FIG. 3 shows an exemplary embodiment of the electro-optical assembly incorporating teachings of the present disclosure in a three-dimensional representation.

FIG. 3 illustrates the electro-optical assembly 14, which is equipped with the optical transmitter element 17. This is located on a spacer block 32, which serves to ensure that, following the mounting of the electro-optical assembly 14, the optical transmitter element 17 extends deeper into the cutout provided for this purpose, so that the optical axis 26 of the optical transmitter element 17 lies in the optical axis of the optical waveguide (not shown, cf. FIG. 1).

The spacer block 32 forms a part of the mounting surface 16, with first contact surfaces 33 being provided thereon, to which the optical transmitter element is attached (for example by means of a soldered connection or an electrically conductive adhesive). The optical transmitter element can be an LED, for example. This has an optical collection component 34, which is mounted on a radiating surface not shown in more detail and concentrates the radiated light along the optical axis 23. The electro-optical receiver element can be a photodiode, for example (not shown).

The first contact surfaces 33 are connected to the second contact surfaces 28 via conductor paths 35 which, as shown in FIG. 2, are provided for the electrical contacting of the transmitter element 17 with the circuit carrier 11. Furthermore, the carrier component 15 has first additional contact surfaces 30, which together with the second contact surfaces 28 are distributed symmetrically around the transmitter element 17 within a ring-shaped mounting area 36 (indicated by dash-point lines). For a mounting of the electro-optical assembly 14 on a circuit carrier, it is therefore possible to achieve a mechanically stable composite structure. The mechanical load on the electrical contacts of this connection is reduced on account of the connections formed via the first additional contact surfaces 30. The electrical connections can therefore be produced for example by means of a reflow soldering process, with the risk of tolerances occurring as a result of an oblique position of the carrier component 15 in relation to the circuit carrier being reduced as far as possible on account of the symmetrical alignment of the soldered connections around the optical transmitter element 17.

Figure 4:
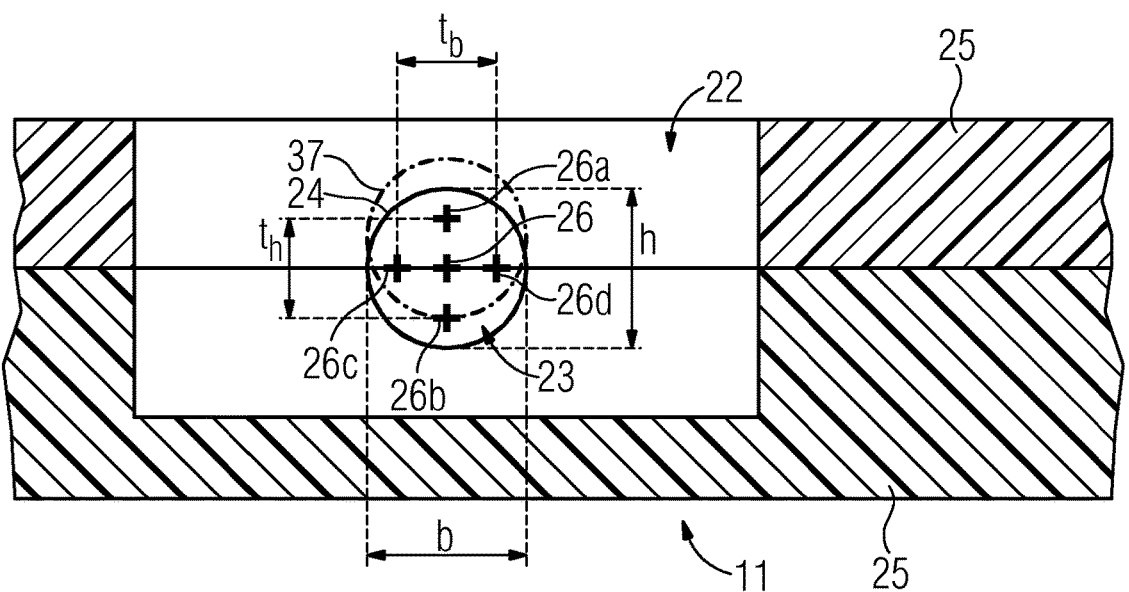
FIG. 4 shows possible tolerance deviations between optical waveguide and optical element in a segment of an exemplary embodiment of the electro-optical circuit incorporating teachings of the present disclosure.

FIG. 4 shows the possible effect of the occurrence of tolerances during the mounting of the electro-optical assembly on the circuit carrier 11. In the exemplary embodiment according to FIG. 4, a round optical waveguide 24 is used, which is laminated between the layers 25 of the circuit carrier 11. This can be a glass optical waveguide, for example. This makes the round end face 23 available in the cutout 22 for producing the optical interface.

A radiating or receiving surface 37 (referred to in the following as surface for short) of an optical element 18, 19 (not shown) is indicated by a dot-dash line. A tolerance-induced offset can occur during the mounting of the optical element, so that the optical axis 26 is subject to tolerance. The optical axis 26 according to FIG. 4 is predefined by the optical waveguide 24, while the optical axis 26a of the optical transmitter element (not shown) or optical receiver element (represented by the surface 37) has an upward height offset. Likewise, a downward height offset is also conceivable, which is indicated by the optical axis 26b. The upward or downward height offset must not exceed one third of the height h of the optical waveguide shown in FIG. 4. From this, a tolerance range $t_h$ with the addition of the possible upward or downward height offset is determined as $$t_h = \frac{2}{3}h.$$

The tolerance range $t_b$ is determined in the same manner for a horizontal offset. Because the exemplary embodiment according to FIG. 4 comprises an optical waveguide 24 with a round cross-section, this is the same size and is determined as:

$$t_b = \frac{2}{3}b.$$

For a round cross-section, h=b is true, so that the tolerance range in the horizontal direction is represented by the two optical axes 26c and 26d, with the distance between these two optical axes 26c, 26d and the optical axis 26 predefined by the optical waveguide 24 amounting to no more than one third of the width b.

What is claimed is:

1. An electro-optical circuit with an optical transmission path, the circuit comprising:
   an electro-optical assembly having an optical transmitter element and/or an optical receiver element mounted on a mounting surface of a carrier component;
   a circuit carrier with a mounting side and an embedded optical waveguide exposed with an end face in a cutout in the mounting side;
   an optical interface between the electro-optical assembly and the optical waveguide;
   wherein the optical transmitter element and/or the optical receiver element is mounted on the carrier component with an alignment of its respective optical axis parallel to the mounting surface;
   wherein the optical assembly is mounted on the circuit carrier with the mounting surface facing toward the mounting side; and
   the optical transmitter element and/or the optical receiver element projects into the cutout and forms an optical axis with the exposed optical waveguide; and
   first contact surfaces on the mounting surface of the carrier component;
   wherein the optical transmitter element and/or the optical receiver element is electrically contacted on the first contact surfaces;
   second contact surfaces on the mounting surface;
   wherein the first contact surfaces are electrically connected to the second contact surfaces and are electrically connected to third contact surfaces on the mounting side of the circuit carrier; and
   wherein the second contact surfaces are distributed symmetrically around the optical transmitter element and/or the optical receiver element.

2. The electro-optical circuit as claimed in claim 1, further comprising additional contact surfaces on the mounting surface;
   wherein the additional contact surfaces have no electrical connection to the circuit formed by the electro-optical assembly and are connected to second additional contact surfaces on the mounting side of the circuit carrier.

3. The electro-optical circuit as claimed in claim 2, wherein a totality of the second contact surfaces and the additional contact surfaces are distributed symmetrically around the optical transmitter element and/or the optical receiver element.

4. The electro-optical circuit as claimed in claim 1, further comprising several optical transmitter elements and/or optical receiver elements mounted on the carrier component.

5. The electro-optical circuit as claimed in claim 1, wherein the optical waveguide comprises a glass waveguide.

6. The electro-optical circuit as claimed in claim 1, wherein the optical waveguide has a cross-sectional area of at least 0.05 mm2 and at most 1 mm2.

7. The electro-optical circuit as claimed in claim 1, wherein the optical waveguide has a round cross-section and a diameter of at least 250 μm and at most 1000 μm.

8. The electro-optical circuit as claimed in claim 1, wherein the optical transmitter element transmits optical signals at a frequency of at least 1 kHz and at most 1 MHz and/or the optical receiver element receives optical signals at a frequency of at least 1 kHz and at most 1 MHz.

9. The electro-optical circuit as claimed in claim 1, wherein a permissible positioning tolerance between the electro-optical assembly and the circuit carrier:
    in a direction perpendicular to the mounting side amounts to at most half a height of the optical waveguide; and
    in a direction parallel to the end face of the optical waveguide and parallel to the mounting side amounts to at most half a width of the optical waveguide.

10. The electro-optical circuit as claimed in claim 1, wherein the carrier component includes a spacer block, on which the optical transmitter element and/or the optical receiver element is mounted.

11. The electro-optical circuit as claimed in claim 1, wherein the optical transmitter element and/or the optical receiver element is equipped with an optical collection component.

12. A method for producing an optical interface in an electro-optical circuit, the method comprising:
    providing a circuit carrier with a mounting side and an embedded optical waveguide exposed with an end face in a cutout in the mounting side;
    mounting an electro-optical assembly including an optical transmitter element and/or an optical receiver element on a mounting surface of a carrier component; wherein the optical interface between the electro-optical assembly and the optical waveguide results from the optical transmitter element and/or the optical receiver element being mounted on the carrier component with an alignment of its respective optical axis parallel to the mounting surface and the optical assembly being mounted on the circuit carrier with the mounting surface facing toward the mounting side;
    wherein the optical transmitter element and/or the optical receiver element is introduced into the cutout and forms an optical axis with the exposed optical waveguide;
    making an electrical connection between first contact surfaces on the mounting surface of the carrier component and the optical transmitter element and/or the optical receiver element;
    wherein the first contact surfaces are electrically connected to second contact surfaces on the mounting surface; and
    making an electrical connection between the second contact surfaces and third contact surfaces on the mounting side of the circuit carrier;
    wherein the second contact surfaces are distributed symmetrically around the optical transmitter element and/or the optical receiver element.

13. The method as claimed in claim 12, wherein the electro-optical assembly is mounted on the circuit carrier by establishing an electrical connection between the carrier component and the circuit carrier.

14. The method as claimed in one of claim 12, further comprising applying, during mounting, a positioning tolerance limit between the electro-optical assembly and the circuit carrier, in a direction perpendicular to the mounting side at most half a height h of the optical waveguide, and in a direction parallel to the end face of the optical waveguide and parallel to the mounting side at most half a width b of the optical waveguide.

\* \* \* \* \*